(12) United States Patent
Hammerschmidt

(10) Patent No.: US 9,176,521 B2
(45) Date of Patent: Nov. 3, 2015

(54) SIGNAL GENERATION FOR SPECTRAL MEASUREMENTS

(75) Inventor: Dirk Hammerschmidt, Villach (AT)

(73) Assignee: Infineon Technologies AG, Munich (DE)

(*) Notice: Subject to any disclaimer, the term of this patent is extended or adjusted under 35 U.S.C. 154(b) by 407 days.

(21) Appl. No.: 12/894,188

(22) Filed: Sep. 30, 2010

(65) Prior Publication Data

US 2012/0081105 A1   Apr. 5, 2012

(51) Int. Cl.
*G01R 23/16*   (2006.01)
*G06F 1/025*   (2006.01)
*H03M 3/00*    (2006.01)

(52) U.S. Cl.
CPC . *G06F 1/025* (2013.01); *H03M 3/43* (2013.01)

(58) Field of Classification Search
USPC ........................................... 324/76.21, 76.22
See application file for complete search history.

(56) References Cited

U.S. PATENT DOCUMENTS

| | | | | |
|---|---|---|---|---|
| 5,272,655 A | * | 12/1993 | Roza | 708/313 |
| 5,485,393 A | * | 1/1996 | Bradford | 702/60 |
| 6,687,868 B1 | * | 2/2004 | Furukawa et al. | 714/740 |
| 7,114,366 B1 | * | 10/2006 | Jones et al. | 73/1.01 |
| 7,253,644 B2 | * | 8/2007 | Song | 324/698 |
| 7,528,755 B2 | * | 5/2009 | Hammerschmidt | 341/143 |
| 7,642,767 B2 | * | 1/2010 | Willis | 324/76.47 |
| 2009/0161802 A1 | * | 6/2009 | Malla et al. | 375/345 |

OTHER PUBLICATIONS

Raman, 2006, "A Digitally Controlled MEMS Gyroscope with Unconstrained Sigma-Delta Force-Feedback Architecture".*
Raman, 2006, "A digitally COntrolled MEMS Gyroscope with Unconstrained Sigma-Delta FOrce Feedback Architecture".*
A Digitally Controlled MEMS Gyroscope With Unconstrained Sigma-Delta Force-Feedback Architecture; Raman et al. Ghent University, Ghent, Belgium, MEMS 2006, Istanbul, Turkey, Jan. 22-26, 2006; pp. 710-713.

* cited by examiner

*Primary Examiner* — Tung X Nguyen
*Assistant Examiner* — Feba Pothen
(74) *Attorney, Agent, or Firm* — Harrity & Harrity, LLP

(57) ABSTRACT

Embodiments related to signal generation for spectral measurements are described and depicted. In one embodiment, a signal generator for a spectral measurement is configured to generate a digital sigma-delta modulated signal. The signal generator has a digital output to feed the digital sigma-delta signal to a probe.

25 Claims, 6 Drawing Sheets

SIGNAL GENERATION FOR SPECTRAL MEASUREMENTS

BACKGROUND

In many applications, spectral measurements are a tool to provide analysis or determining of one or more parameters of a probe. Such parameters typically include properties of the probe which allows determining physical, chemical, biological or other characterizations of the probe. Examples include for example the analysis of chemical compositions such as the analysis of the liquid in a tank etc. Spectral measurements require the generation of a stimulus signal having a certain spectrum range.

In view of the need for generating the stimulus with a certain spectrum range, existing spectral analysis systems include complex circuitry in order to provide the signal over the spectral range. This typically affects the price of such systems and increases the electric power dissipated in such systems.

SUMMARY

In one aspect, a method includes the feeding of a digital sigma-delta modulated signal to a probe. Based on the digital sigma-delta signal, a response signal is received from the probe. Frequency dependent values of at least one parameter are determined based on the response signal.

In a further aspect, a device includes a signal generator for a spectral measurement. The signal generator is configured to generate a digital sigma-delta signal. The device further includes a digital output to feed the digital sigma-delta modulated signal as a stimulus signal for the spectral measurement to the probe.

In a further aspect, a spectrum analyzer includes a signal generator configured to generate a digital sigma-delta modulated signal and a digital output to feed the digital sigma-delta modulated signal to a probe. The spectrum analyzer further includes an input to receive a response signal from the probe and a response analyzer to determine at least one property of the probe based on the response signal.

In a further aspect, a method includes providing a signal comprising at least partially a quantization noise of a sigma-delta modulation and utilizing the signal as a stimulus signal in a spectral measurement.

In a further aspect, a spectrum analyzer includes a signal generator which is configured to provide a stimulus signal for a spectral measurement. The stimulus signal comprises at least partially a quantization noise of a sigma-delta modulation.

In embodiments, the part of the spectrum which is used for evaluation in the spectral measurement includes at least the frequency components with the highest power density of the quantization noise. In embodiments, these frequency components are located close to the cut-off frequency.

DETAILED DESCRIPTION

Figure 1A:
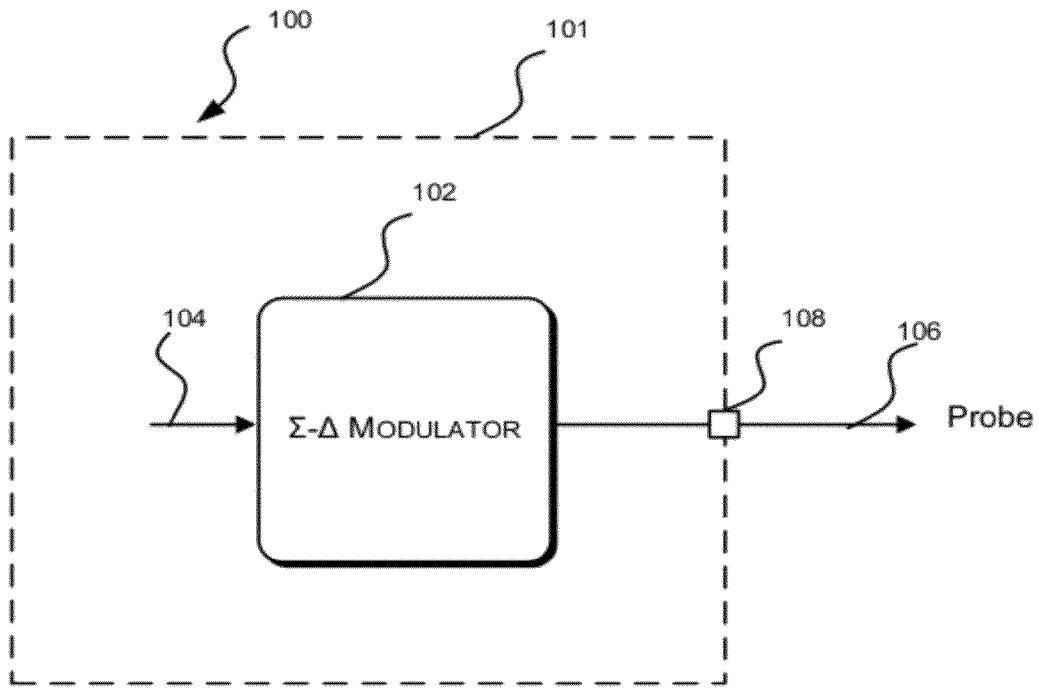
FIG. 1a shows a device according to an embodiment.

The following detailed description explains exemplary embodiments of the present invention. The description is not to be taken in a limiting sense, but is made only for the purpose of illustrating the general principles of embodiments of the invention while the scope of protection is only determined by the appended claims.

In the exemplary embodiments shown in the drawings and described below, any direct connection or coupling between functional blocks, devices, components or other physical or functional units shown in the drawings or described herein can also be implemented by an indirect connection or coupling unless otherwise. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number.

FIG. 1a shows an embodiment of a device 100 including a signal generator 101 for generating a stimulus signal for a spectral measurement. A spectral measurement may include any type of analysis, determining, evaluation or estimation of at least one frequency-dependent parameter such as a complex impedance of the probe, a conductivity or dielectricity of the probe or other parameters which provide a characterization of the probe. The spectral measurement may determine information related to at least two values of the frequency-dependent parameter at different frequencies. Typically, a series of values at different discrete frequencies may be determined in the spectral measurement. The discrete frequencies may be equidistant. In embodiments, the spectral measurement may be based on a Fourier-transformation such as a Fast-Fourier-Transformation (FFT) to provide values of the spectral measurement.

FIG. 1a shows the signal generator 101 to include a sigma-delta modulator 102 which provides a sigma-delta modulation of an input signal 104. The sigma-delta modulator is coupled to a digital output 108 for feeding the digital sigma-delta modulated signal as a stimulus signal for a frequency dependent measurement via the digital output 108 to a probe. The digital output may in some embodiments include an output stage which is designed such that it can be described by a known transfer function that can be used as a correction in the calculation of the measurement. One embodiment of such an output stage includes a low ohmic switch which switches between two defined voltage levels. The output stage can then be accounted in the calculations as a constant factor that converts digital signals into amplified 2-level voltage signals, i.e. amplified digital signals. This further avoids the need for additional A/D conversion to measure the stimulus.

As will be explained in detail further below, the signal generator can in some embodiments be integrated on a single semiconductor chip together with a signal-response analyzer which provides the analysis and comparing of the probe's response signal with the stimulus signal. This results in a complete spectrum analyzing system being integrated on a single chip.

Sigma-delta modulation which is sometimes also referred to as delta-sigma modulation is a concept in which a signal is quantized and the quantization error is introduced back to the signal path via a feedback loop. Typically, a loop filter is employed either in the feedback path or in the forward path to provide noise shaping.

Figure 3:
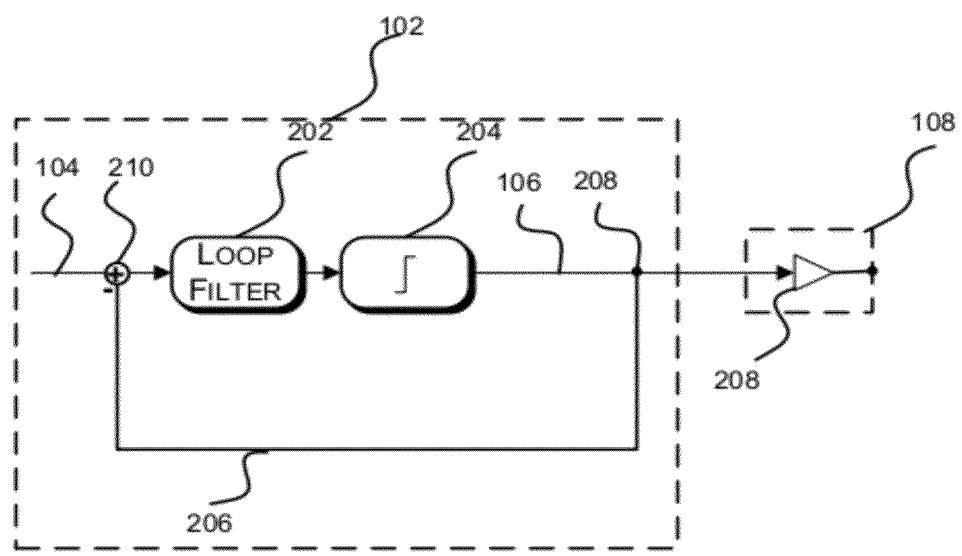
FIG. 3 shows a sigma-delta modulator according to an embodiment.

An exemplary embodiment of a sigma-delta modulator 102 in which a loop filter 202 is implemented in a forward path is shown in FIG. 3. FIG. 3 shows the loop filter 202 connected in the forward path to a quantizer 204. Quantizer 204 can be a 1-bit quantizer, a two bit quantizer or other multi-level quantizers. Implementing the quantizer 204 as a 1-bit quantizer provides the advantage that the sigma-delta modulated output signal 106 is a binary digital signal which can be easily amplified prior to the feeding to the probe by using digital buffers. Furthermore, binary digital signals can be easily Fourier-transformed in the analysis of the signal as will be described below in more detail. Digital buffers may for example include amplifying field-effect transistors such as any kind of MOS-transistors. FIG. 3 shows the output 108 to include a digital buffer 208 for amplifying the sigma-delta modulated digital signal 106. The quantizer 204 is connected via a node 208 with the digital buffer 208.

To implement the feedback loop, a feedback path 206 is connected to the node 208 to feed the signal 106 back to the feed-forward path in order to subtract at a node 210 the quantization error introduced by the quantizer 204 from the input signal 104. As noted above, FIG. 3 shows only one of many implementations of a sigma-delta modulator. For example, in some embodiments the integrating loop filter 202 may be provided in the feed-back loop. The loop filter 202 may have any filter order. Furthermore, the sigma-delta modulator may have in some embodiments multiple feedback loops. Such embodiments include for example MESH sigma-delta modulators.

In one aspect, the using of the sigma-delta modulated signal as a stimulus signal for the spectral measurement allows the stimulus signal to be generated in a circuit of low complexity. This results in cost savings and space savings compared to existing solutions and provides an easy to mount and very handy spectral analysis tool. In particular the signal generator 101 can be easily implemented in exemplary embodiments on a single semiconductor chip resulting in a very compact implementation with low costs, low spatial extensions and low weight. Such signal generators on a single chip can be produced at very low costs and can be easily placed at locations near the probe such as a fuel tanks etc. without consuming much space and without increasing the weight of the probe.

In embodiments, the signal generator 101 including the sigma delta modulator 102 and the output 106 is implemented as a pure digital processing circuit. This avoids the presence of D/A or A/D converters which would increase the area and cost of the chip. In such embodiments, a digital signal generator may be provided on the chip for providing the digital input signal 104.

In some embodiments, the digital input signal 104 is a random or pseudo-random digital signal such as an output signal of a shift register fed back to its input via logic combinations of the bits. However, the high frequency shape of the quantization noise is not critically depending on the shape of the digital input signal 104. Thus, input signal 104 may in other embodiments include other digital signals such as chirp signals or sequences of pulses. Generally, the sigma-delta modulation may be applied to any kind of signal and the thus obtained sigma-delta modulated signals typically have a frequency spectrum capable of providing the stimulus signal for spectral measurements. The use of non-repetitive input signals and in particular the use of random or pseudo-random input signals provides the advantage of avoiding repeated patterns in the digital sigma-delta modulated signal.

In embodiments, the upper frequency limit of the digital input signal 104 is lower than that of the sigma delta modulated signal 106. In other words, a digital input signal 104 of low frequency is input to the sigma-delta modulator. After the sigma-delta modulation, a digital output signal 106 including the quantization noise is obtained with frequencies components higher than the frequencies of the digital input signal. The sigma delta modulator may in some embodiments include a sampler clocked by a clock signal to obtain an over-sampling of the digital input signal 104.

The digital input signal 104 may be provided by a digital signal generator already with the low frequency or may be provided with a higher frequency and then filtered in a digital low pass filter prior to the feeding into the sigma-delta modulator 102.

It is hereby to be noted that while in many other usages of sigma-delta modulators for example in A/D or D/A converters the high frequency components of the sigma-delta modulated signal which are introduced by the quantization noise are filtered out to provide a clean representation of the input signals, the high frequency components of the digital sigma-delta modulated signal including the quantization noise are actually providing in embodiments described herein the spectrum components which are used for the spectral measurements. In other words, while in typical other usages of sigma delta modulators the generated noise is considered to be a component to be eliminated, the signal generator 101 actually feeds at least a part of the generated noise and the frequency spectrum provided by the quantization noise to the probe and utilizes it for spectral measurements.

In embodiments, the spectral shape obtained by a sigma-delta modulation is characterized by the shaping of the quantization noise to higher frequencies. The spectral density of the noise increases until a cut-off towards higher frequencies. This allows generating a stimulus signal which comprises the high frequency components near the cut-off which can be used in a spectral measurement. The remaining lower frequency part of the signal is generated by a signal generator and the shape is not critical to the input signal. The high-frequency cut-off at the clocking frequency of the signal corresponds to the inverse of the time period between two successive digital samples. The cut-off frequency may in embodiments depend on the clock frequency provided for the sigma-delta modulation. In the described embodiments, the frequency spectrum of the digital sigma-delta modulated signal which is utilized for the analysis is based on a spectrum of the quantization noise introduced to a digital input signal during a sigma-delta modulation.

Figure 2A:
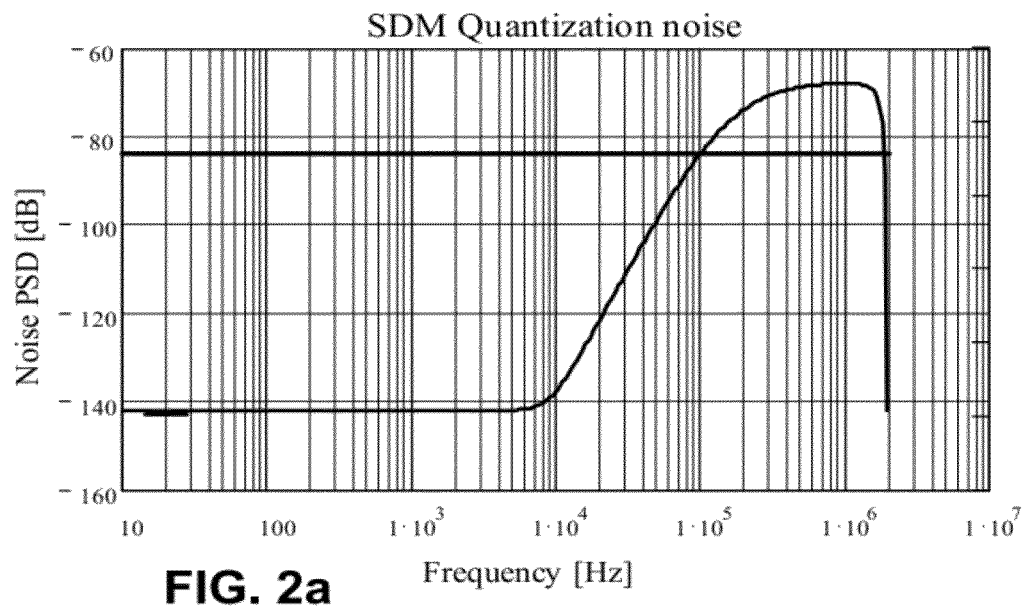
FIGS. 2a and 2b show power spectral densities versus frequency according to embodiments.

An exemplary power spectral density of the quantization noise introduced by the sigma-delta modulation is shown in FIG. 2a as a function of the frequency. The example of FIG. 2a utilizes a random signal input as described above. FIG. 2a shows the cut-off towards high frequencies and a relatively small decrease in the spectral power density from the cut-off limit towards lower frequencies. In view of this only small decrease of less than 20 dB (decibel) over roughly one order of magnitude (one decimal power), the power spectral density can be considered to have a substantial white behavior for about roughly one order of magnitude.

In view of the above, in some embodiments the frequency dependent values are determined by utilizing only a spectral part of the sigma-delta modulated signal including a spectral region with the highest power density of the quantization noise for determining frequency dependent values. The range of the power density used may for example a frequency range with a power density within a range of less than 20 dB lower than the highest power density.

In some embodiments, at least the spectrum over about one order of magnitude starting from the highest frequency component of the sigma-delta modulated signal towards lower frequencies is utilized for the spectral measurement and determining of at least one parameter of the probe.

In some embodiments, the sigma-delta modulation output signal may be modified prior to the feeding to the probe. In embodiments described herein, the stimulus signal includes at least partially the quantization noise of the sigma-delta modulation. In some embodiments, the sigma-delta modulated signal fed to the probe may also include modifications of the sigma-delta output signal in which a spectral part of the sigma-delta output signal (for example a low frequency part) is modified or eliminated but at least a part of the quantization noise spectrum of the sigma-delta modulation is fed to the probe for providing the spectral measurement.

In some embodiments, multiple sigma-delta modulated signals having different cut-off frequencies are provided in order to extend the range of substantially white behavior of the frequency spectrum for the measurement. The different sample frequencies of the multiple digital sigma-delta modulated signals can be generated by utilizing a clocking in the sigma-delta modulator which is variable in frequency. By switching from one clock frequency to another clock frequency, the sigma delta modulated signal is generated with different sample frequencies, i.e. with different cut-off frequencies. The switching may for example be provided by generating a master clock signal at a frequency at least as high as the highest cut-off frequency and then down-converting the master clock in order to obtain clock signals at different lower frequencies. It is however to be understood that this is only one of many examples of a clock signal generator for the sigma-delta modulation capable of providing variable clock frequencies.

It is an advantage of the using of the sigma-delta modulator that in order to generate a signal having a different cut-off frequency, no further changes than the shifting of the clock frequency to different frequencies are required. Thus, by subsequently providing the clock at different frequencies, a substantially white spectrum up to 4 orders of magnitude or more can be generated by the sigma-delta modulation. In some embodiments, subsequent clock frequencies used for the spectral measurement may differ by a factor k, wherein k is between 5 and 20. In some embodiments, k may be between 8 and 13. In some embodiments k may be between 5 and 10. In other embodiments, k may be roughly 10.

Figure 2B:
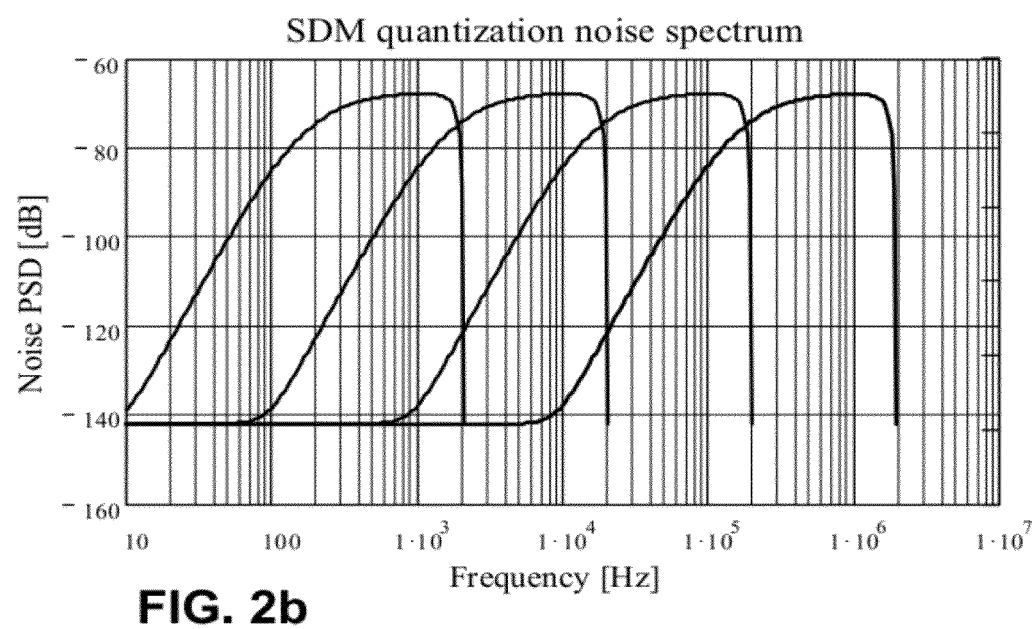

FIG. 2b shows an example having four power spectral densities which correspond to four different clocking frequencies. In the example of FIG. 2b the subsequent frequencies differ by a factor 10, i.e. the next higher clocking frequency used for generating the sigma-delta modulated signal for the spectral measurement is 10 times the previous used clocking frequency. However, as outlined above, other differences in the frequencies may be used.

The sigma-delta modulated signals with different cut-off frequencies may be generated subsequently and therefore also be fed to the probe subsequently. The spectral analyzer therefore provides subsequent partial spectral measurements with substantially white input signal spectrum which are added together to provide the measurement over the complete range covered by the different sigma-delta modulated signals. Furthermore, the spectrum used for the spectral measurement may be tailored. For example if only a first band and a second band are of interest, the clocking frequencies may be provided to cover a substantially white noise spectrum only for these bands of interest. In other words, the spectrum utilized for the spectral measurement may not be contiguous but may be separated in smaller bands of interest.

In view of the above, in one embodiment a first and second sigma-delta modulated signal having different clocking frequency are feed to the probe as stimulus signal. A first and second response signal are then received from the probe. The first response signal is based on the feeding of the first sigma-delta modulated signal to the probe and the second response signal is based on the feeding of the second sigma-delta modulated signal. The frequency-dependent values are determined by utilizing a first spectral part of the first response signal and a second spectral part of the second response signal. The first spectral part includes a frequency range in which the first sigma-delta modulated signal has a higher noise power density than the second sigma-delta modulated signal and the second spectral part includes a frequency range in which the second sigma-delta modulated signal has a higher noise power density than the first sigma-delta modulated signal. It is of course to be understood that this can be extended to more than two stimulus signals such that for each response signal a frequency range is utilized for determining the parameters which has the highest power density compared to the power density of the other stimulus signals at the same frequency.

In order to analyze the response signal, a signal response analyzer is provided in embodiments. In some embodiments, the signal-response analyzer for analyzing the response signal and determining one or more physical, chemical, biological or other parameters of the probe may be integrated in the device 100. This allows in some embodiments a compact and low cost digital signal analyzing system which can be fully integrated on a single semiconductor chip. These systems have almost no weight and can be easily mounted even when the space for mounting is very limited.

Figure 1B:
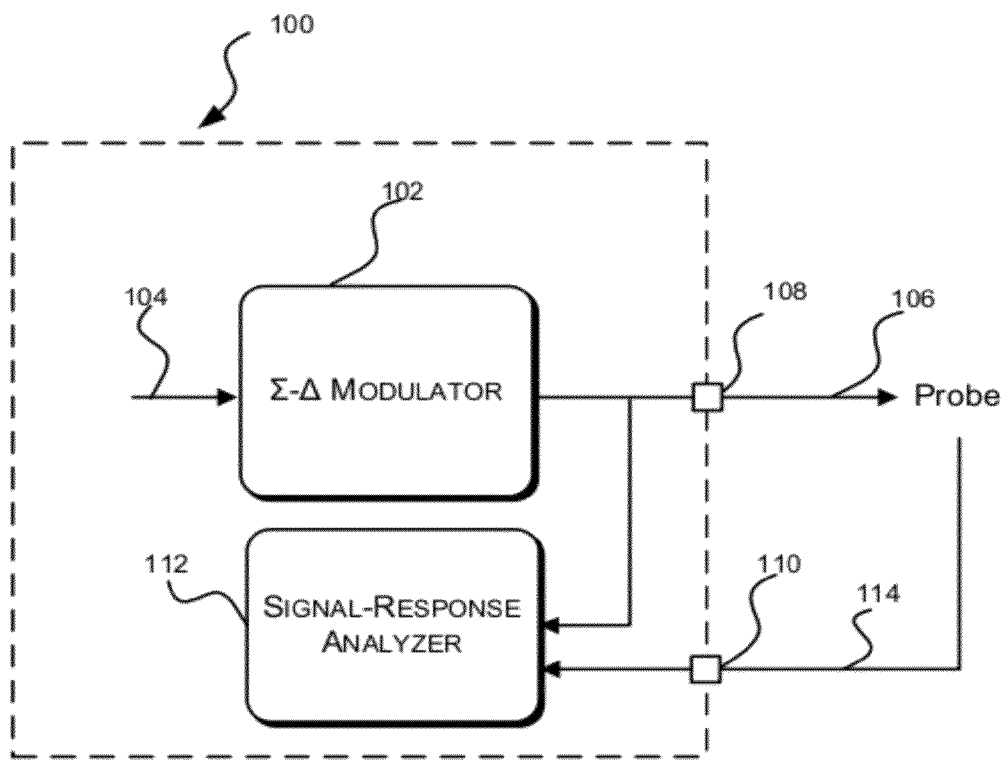
FIG. 1b shows a device according to a further embodiment.

FIG. 1b shows an embodiment in which the signal generator and a signal response analyzer 112 are integrated within the device 100. The device 100 has in FIG. 1b an input 110 to receive a response signal 114 from the probe. The response signal 114 is then provided from the input 110 to a first input of the signal-response analyzer 112. Furthermore, the original sigma-delta modulated signal 106 feed to the probe as a stimulus signal is provided to a second input of the signal-response analyzer 112. The signal-response analyzer 112 then provides the spectral measurement based on the stimulus signal and the response signal.

The response signal contains modifications to the stimulus signal which are introduced by the presence of the probe. For example, the response signal may in one embodiment represent the stimulus signal after transmission through the probe and may include the signal modifications introduced during the transmission through the probe. In other embodiments, the response signal may for example include a reflected signal component. The response signal may for example include a voltage signal or a current signal. In embodiments, the response signal may be sampled and A/D converted synchronous to the clock frequency of the sigma-delta modulated signal. Therefore, in some embodiments, the clock signal of the sigma-delta modulated signal may be provided to an input of the circuit receiving the response signal from the probe for providing the synchronous sampling and A/D conversion.

Similar to the signal generator 101, in some embodiments the signal-response analyzer 112 can be implemented completely as a digital circuit resulting in a full signal analyzing system which is compact and has very low costs. Such analyzing systems may for example be employed in mass production systems which have a need for spectral analyzing measurements such as spectral measurements in capacitive sensors used for example to detect fluid or solid materials.

Figure 4A:
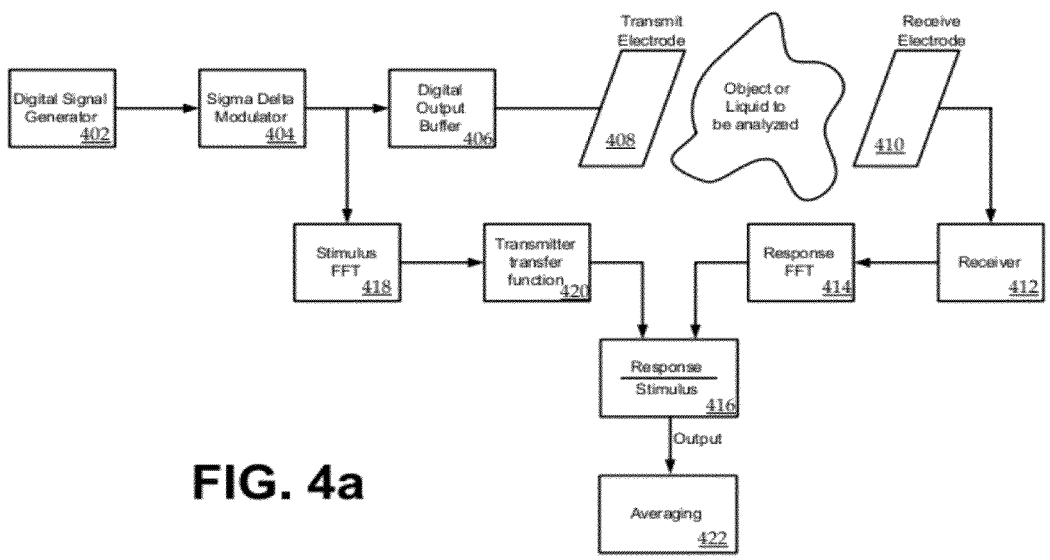
FIGS. 4a and 4b show block diagrams according to embodiments.

FIG. 4a shows a block diagram of an exemplary embodiment. The block diagram shows a digital signal generator block 402 which generates a low frequency digital signal which is feed to the sigma-delta modulator block 404 as input signal. The sigma delta modulated signal output from the sigma-delta modulator block 404 is provided to a digital output buffer block 406 and feed from the digital output buffer block 406 to a transmit electrode 408. The digital output buffer block 406 may for example include a transistor such as a MOS-transistor for a digital output of the stimulus signal. The transmit electrode 408 is charged and discharged based on the signal received at the transmit electrode 408. The transmit electrode 408 is capacitive-coupled to a receive electrode 410 to transfer the signal wireless from the transmit electrode 408 to the receive electrode 410 through an object or liquid which is to be analyzed. The response signal received at the receive electrode 410 is then provided to a receiver block 412 and then feed to a Response-FFT block 414. The Response FFF block 414 provides a Fourier-Transformation of the response signal and feeds the result to a Response/Stimulus block 416.

Furthermore, the stimulus signal output from the sigma-delta modulator block 404 is further provided to a Stimulus-FFT block 418 which provides a Fourier-Transformation of the stimulus signal. The result of the Fourier-Transformation of the stimulus signal is provided to a transmitter transfer function block 420 which corrects the result of the Fourier-transformation of the stimulus signal with regards to modifications which are not caused by the transfer of the signal through the object or liquid. Such corrections may include corrections addressing the transfer of the stimulus signal from the sigma-delta modulator block 404 to the transmit electrode 408, from the transmit electrode to the probe, from the probe to the receive electrode, or from the receive electrode 410 to the Response-FFT Block 414. These corrections may for example depend on the transmission cable for feeding the signals to the electrode, the geometry of the electrode arrangement or other materials which are provided between the electrode and the probe. For example, when electrodes in a capacitive measurement are provided outside of a tank, the tank material may introduce modifications of the signal which can be corrected by the transfer function block 420.

The corrected Fourier transformation of the stimulus signal is then provided to the response/stimulus block 416. The response/stimulus block 416 provides a division of the result from the response FFT and the corrected result of the stimulus FFT to obtain a frequency-dependent characteristic of the parameter which is analyzed. The parameter to be measured might in the above example for example include real or complex-valued impedance which allows determining the characteristic of the dielectric constant $\in$ and the conductivity $\sigma$. In the described embodiment, multiple repetitions of the spectral measurement are provided in order to increase the reliability of the spectral measurement. The output from the response/stimulus block 416 is therefore provided to an averaging block 422 configured to average the result from multiple spectral measurements. The averaging provided in the averaging block 422 may utilize any known concept of averaging such as arithmetic mean, geometric mean, weighted averaging etc. Based on the provided spectral measurement, in some embodiments a material composition of the probe may be determined for example in a capacitive measurement as will be described below in more detail.

Figures 5A, 5B, 5C, 5D:
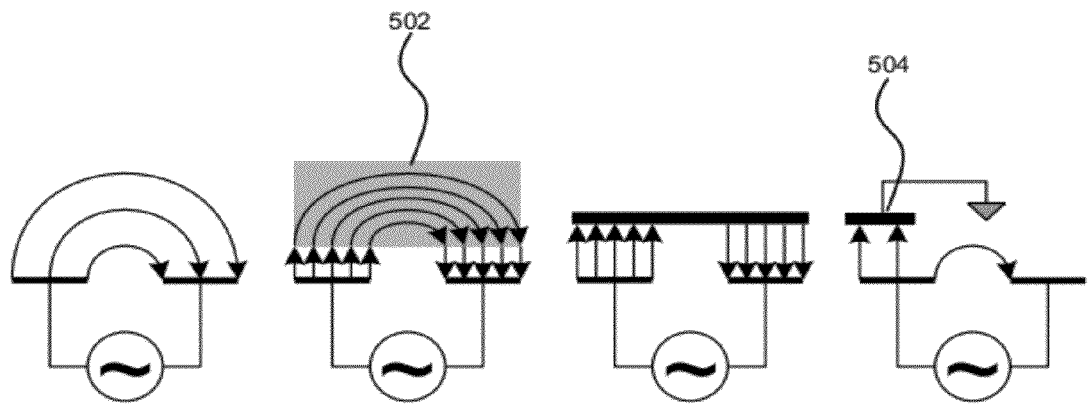
FIGS. 5a to 5e show exemplary electrode configurations for capacitive measurements.

Capacitive measurements can be arranged in a variety of electrode configurations. Exemplary embodiments are now shown with respect to FIGS. 5a-5d. FIGS. 5a and 5b show a first capacitive measurement configuration in which the electrodes are provided lateral to each other. FIG. 5b shows the influence to the field lines which are shown with a probe to be denser than in the absence of a probe 504 (FIG. 5a). Furthermore, FIG. 5c shows a configuration wherein an electric conductor is provided opposed to each of the electrodes. Between the electric conductor and the respective electrode, measurement regions are established which are sensitive to dielectric or conductive changes of probes. FIG. 5d shows an electrode configuration where a part of the electric field is shunt to ground 504 and a part of the electric field is established between the two electrodes.

Figure 5E:
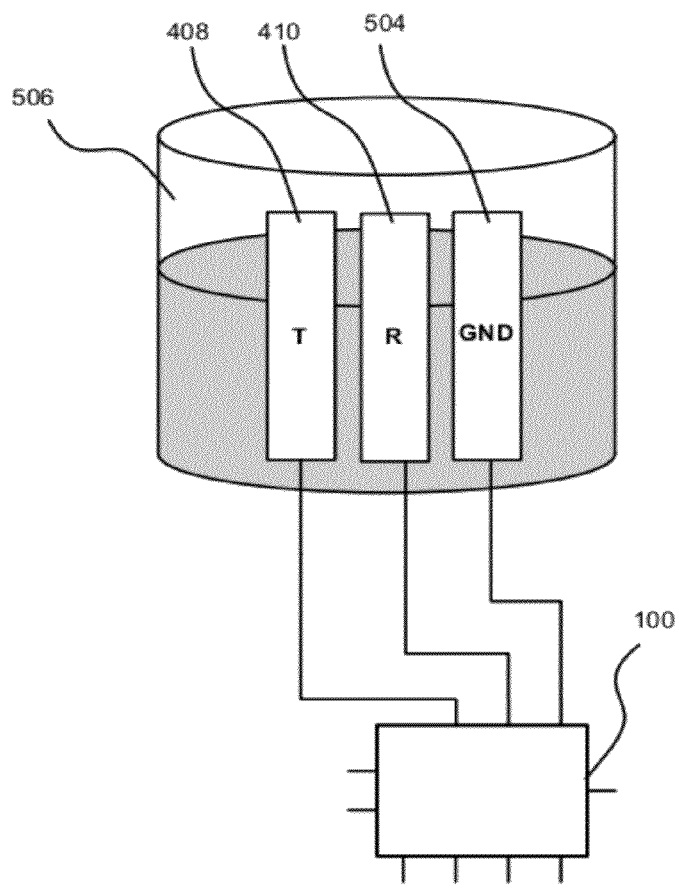

One embodiment of an implementation of the configuration of FIG. 5d with a device 100 implemented in a semiconductor chip is shown in FIG. 5e. FIG. 5e shows a tank 506 on which the transmission electrode 408, the receive electrode 410 and the ground electrode 504 are mounted on an outer surface. Each of the electrodes is connected to a corresponding input of the device 100.

In exemplary capacitive measurements, voltages between 1 and 10 Volt may be supplied to the probe and currents of up to 100 mA may be drawn during the measurements.

A model for the above described embodiment of FIG. 5d which may be used to determine the dielectricity and conductivity will now be described with respect to FIG. 6.

Figure 6:
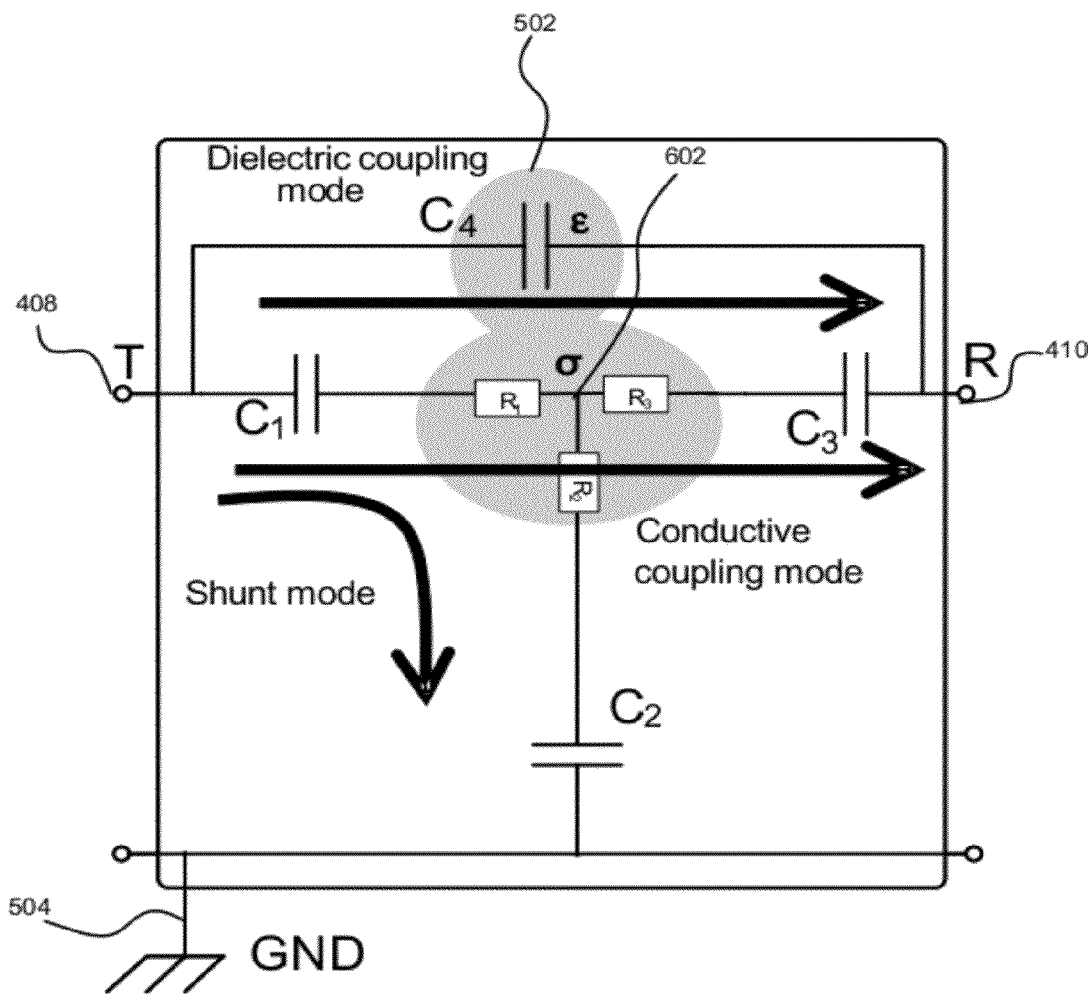
FIG. 6 shows an exemplary model for capacitive measurements according to an embodiment.

FIG. 6 shows the probe 502 between the transmit electrode 408 and the receive electrode 410. The stimulus signal is provided via the transmit electrode 408 to the probe 502 and from the probe 502 to the receive electrode 410.

The influence to the stimulus signal by the probe may be characterized by the complex-valued permittivity of the material within the probe. The complex-valued permittivity is the result of a real-valued dielectric component and an imaginary-valued conductive component and depends on the stimulus signal frequency. Therefore, the frequency characteristic of this parameter can be considered unique for each material and may allow the determining of the material composition of the probe. The capacitive component basically addresses the electric displacement within the probe. The conductive component basically addresses the energy loss of a displacement current induced in the probe. The signal path from the transmit electrode 408 to the receive electrode 410 can in view of the above be split into a path corresponding to a conductive coupling mode and a path corresponding to a dielectric coupling mode. Furthermore, a part of the signal is shunted from the transmit electrode 408 to ground 504 which is represented in the model by a shunt mode path.

The conductive coupling mode which is characterized by DC resistances of the material can be represented in the model by resistances R1, R2 and R3. In the model, resistances R1, R2 and R3 are coupled at one end to a node 602 and at the other end via respective capacitances C1, C2 and C3 to the transmit electrode 408, the ground electrode 504 and the receive electrode 410. In the model, the capacity C1 represents the capacity between the transmit electrode 408 and the probe 502 via which the stimulus signal is coupled into the probe. The capacity C2 represents the capacity between the probe 502 and the ground electrode 504 via which the signal is coupled from the probe to ground. The capacity C3 represents the capacity between the probe and the receive electrode 410 via which the signal is coupled from the probe to the receive electrode 410. The capacitances C1, C2 and C3 may for example depend on the thickness and the material of the tank. Furthermore, the capacitive coupling is represented in the model by a capacitance C4. The value of the capacitance C4 will change depending on the dielectricity of the probe.

Utilizing the above model, the spectral behavior of the dielectricity or the DC conductivity or both can be obtained. By comparing the behavior to the spectral behavior of known material components, an analysis of the material composition can be provided in some embodiments.

It is however to be understood that the above described model as well as the utilizing of the sigma-delta modulated signal for capacitive measurements is only of exemplary character and that other kind of spectral measurements may be provided by utilizing the sigma-delta modulated signal.

Furthermore, the digital sigma-delta modulated signal fed to the probe by the signal generator 101 may in some embodiments be a conserved signal which has been previously generated by a sigma-delta modulator or simulator of a sigma-delta modulator and then stored in a memory of the signal generator. For feeding the signal to the probe, the signal is then recaptured from the memory and provided to the probe. When the sigma-delta modulated signal has binary levels, the digital samples of the sigma-delta modulated signal may be stored as digital bits in the memory. The storing, recapturing and digital amplifying of the sigma-delta modulated signal with binary level may in some embodiments be easier and faster than for multi-level sigma-delta modulated signals with more than binary level. Furthermore, the corresponding spectrum, i.e. the Fourier-Transformation of the stored sigma-delta modulated signal may in some embodiments also be stored in the memory. This reduces the need for providing an ongoing Fourier-transformation when the sigma-delta modulated signal is fed to the probe.

Figure 4B:
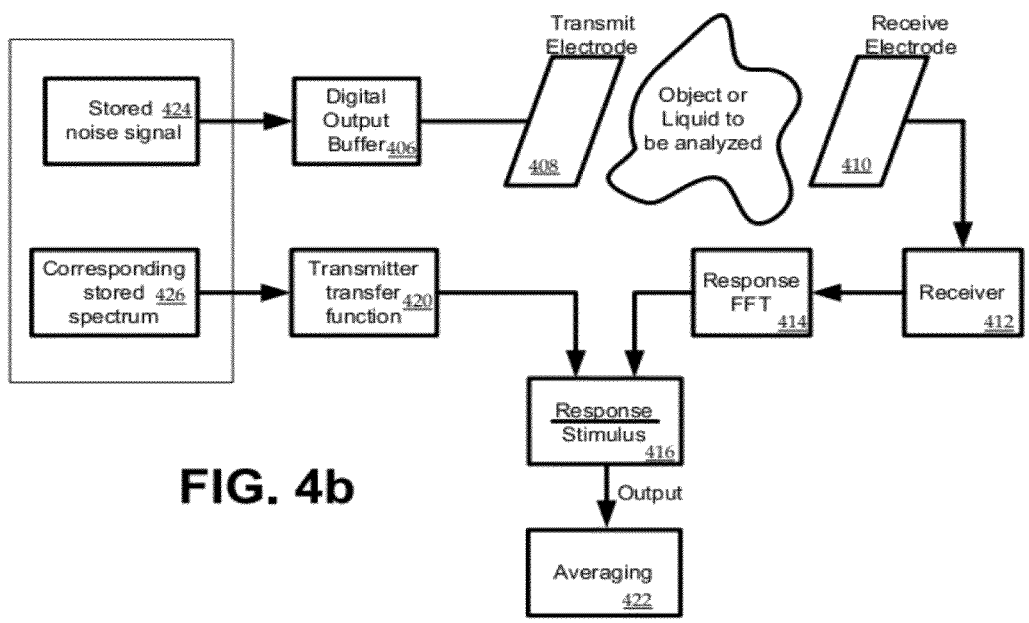

FIG. 4b shows a block diagram of an exemplary embodiment wherein the sigma-delta modulated signal is conserved in a digital memory and provided from the digital memory for feeding the stimulus signal to the probe.

Distinguished from FIG. 4a, the digital signal generator block 402 and the sigma-delta modulator block 404 from FIG. 4a are replaced by a block 424 which stores the sigma-delta modulated noise signal and provides the signal to the digital output buffer 406 for feeding to the transmit electrode 408. Furthermore, in the embodiment of FIG. 4b, a block 426 is provided which stores the corresponding spectrum and outputs the spectrum to the transmitter transfer function block 420.

It is to be noted that in order to save memory, in some embodiments only the spectrum range of interest may be provided in the stimulus signal and the corresponding stored spectrum.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "entity" or "unit" or "device" may in embodiments include any apparatus circuits, hardware implementation, software implementation, firmware implementation, implementation on chips or other semiconductor devices. Furthermore the terms "coupled" or "connected" may be interpreted in a broad sense not only covering direct but also indirect coupling.

It is further to be noted that embodiments described in combination with specific entities may in addition to an implementation in these entity also include one or more implementations in one or more sub-entities or sub-divisions of said described entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is to be noted that combinations of one or more features described in the detailed specification in one or more embodiments with other embodiments are proposed as well as combinations of one or more features described in the detailed specification in one or more embodiments with subject matter described in one or more of the claims.

It is further to be noted that methods disclosed in the specification or in the claims may be implemented by a device having means for performing each of the respective steps of these methods.

What is claimed is:

1. A method comprising:
   feeding a digital sigma-delta modulated signal, including a quantization noise comprising a first frequency spectrum in a frequency range, to a probe,
      the digital sigma-delta modulated signal being generated by a sigma-delta modulation and using a feedback path that provides a signal to reduce a quantization error associated with modulating an input signal, the digital sigma-delta modulated signal being based on the signal and the input signal;
   receiving a response signal from the probe,
      the response signal being based on the digital sigma-delta modulated signal; and determining frequency dependent values of at least one parameter of the probe, in at least a part of the frequency range, based on the response signal, wherein determining the frequency dependent values comprises:

utilizing a spectral part of the sigma delta modulated signal for determining the frequency dependent values, the spectral part including a spectral region with a particular power density of the quantization noise, and wherein the digital sigma-delta modulated signal is generated independent of the response signal from the probe.

2. The method according to claim 1, further comprising: generating an electric field in at least a part of the probe based on the digital sigma-delta modulated signal.

3. The method according to claim 1, wherein the digital sigma-delta signal is a binary-level signal.

4. The method according to claim 1, wherein at least a part of the first frequency spectrum of the digital sigma-delta modulated signal is based on a frequency spectrum of the quantization noise introduced to the input signal during the sigma-delta modulation.

5. The method according to claim 1, wherein the digital sigma delta signal comprises frequency components within a frequency interval ranging from a sample frequency of the digital sigma-delta signal to at least one order of magnitude lower than the sample frequency.

6. The method according to claim 1, wherein
the particular power density of the quantization noise corresponds to a highest power density of the quantization noise.

7. The method according to claim 1, wherein feeding the digital sigma-delta modulated signal to the probe comprises:

feeding a first digital sigma-delta modulated signal having a first cut-off frequency; and feeding at least a second digital sigma-delta modulated signal having a second cut-off frequency.

8. The method according to claim 7, wherein feeding the digital sigma-delta modulated signal to the probe comprises:

generating the first digital sigma-delta modulated signal based on a sigma delta modulation with a first clocking frequency;

generating the at least the second digital sigma-delta modulated signal based on a sigma-delta modulation with a second clocking frequency; and feeding the first digital sigma-delta modulated signal and the at least the second digital sigma-delta modulated signal to the probe subsequently.

9. The method according to claim 8, further comprising:
receiving a first response signal from the probe based on feeding the first digital sigma-delta modulated signal and a second response signal from the probe based on feeding the at least the second digital sigma-delta modulated signal, wherein determining the frequency dependent values includes:

utilizing a first spectral part of the first response signal and a second spectral part of the second response signal for determining the frequency dependent values, wherein the first spectral part includes a frequency range in which the first digital sigma-delta modulated signal has a higher noise power density than the at least the second digital sigma-delta modulated signal, and wherein the second spectral part includes a frequency range in which the at least the second digital sigma-delta modulated signal has a higher noise power density than the first digital sigma-delta modulated signal.

10. The method according to claim 8, wherein the first clocking frequency and the second clocking frequency are separated by a factor k, wherein k is between 5 and 20.

11. The method according to claim 1, wherein the digital sigma-delta modulated signal is generated on a single semiconductor chip.

12. A device comprising:
a signal generator for a spectral measurement, the signal generator being configured to:
generate a digital sigma-delta modulated signal including quantization noise,
the digital sigma-delta modulated signal being generated by a sigma-delta modulation and using a feedback path that provides a signal to reduce a quantization error associated with modulating an input signal,
the digital sigma-delta modulated signal being based on the signal and the input signal; and
a digital output to feed the digital sigma-delta modulated signal to a probe,
wherein a value of a parameter of the probe is determined using a spectral part of the digital sigma-delta modulated signal,
the spectral part including a spectral region with a particular power density of the quantization noise, and
wherein the device is configured such that the signal generator generates the digital sigma-delta modulated signal independent of a response from the probe.

13. The device according to claim 12, wherein the digital sigma-delta modulated signal is a binary-level signal.

14. The device according to claim 12, wherein a frequency spectrum of the digital sigma-delta modulated signal is based on a frequency spectrum of the quantization error introduced to the input signal during a sigma-delta modulation.

15. The device according to claim 12, further comprising:
a sampler to sample a digital signal with a first frequency;
a quantizer to provide a quantized signal;
an integrator; and
a digital output to feed the digital sigma-delta modulated signal to the probe.

16. The device according to claim 12, further comprising:
a sigma delta modulator configured to provide a sigma-delta modulation for a random digital input signal or a pseudo-random digital input signal.

17. The device according to claim 12, wherein the signal generator is further configured to:
generate a first digital sigma-delta signal based on a sigma-delta modulation with a first clocking frequency; and
generate a second digital sigma-delta signal based on sigma-delta modulation with a second clocking frequency.

18. The device according to claim 16, wherein the signal generator is further configured to:
change a clocking frequency of the sigma-delta modulator from a first frequency to a second frequency.

19. The device according to claim 17, wherein the first clocking frequency and the second clocking frequency are separated by a factor k, wherein k is between 5 and 20.

20. The device according to claim 12, wherein the signal generator is implemented on a single semiconductor chip.

21. A spectrum analyzer comprising:
a signal generator to generate a digital sigma-delta modulated signal, including quantization noise, in a frequency range,
the digital sigma-delta modulated signal being generated by a sigma-delta modulation and using a feedback path that provides a signal to reduce a quantization error associated with modulating an input signal,
the digital sigma-delta modulated signal being based on the signal and the input signal;
a digital output to feed the digital sigma-delta modulated signal to a probe;
an input to receive a response signal from the probe; and
a response analyzer to provide a spectral measurement of at least one property of the probe based on an analysis of at least a part of a frequency spectrum of the response signal and the digital sigma-delta modulated signal,
wherein the at least one property is selected from a group comprising:
a complex impedance,
a conductivity, or
a dielectricity.

22. The spectrum analyzer according to claim 21, wherein the signal generator and the response analyzer are integrated on a same semiconductor chip.

23. A method comprising:
providing a signal comprising at least partially a quantization noise of a sigma-delta modulation,
the signal being generated using a feedback path that provides a feedback signal to reduce a quantization error associated with modulating an input signal,
the signal being based on the feedback signal and the input signal; and
providing the signal to a probe to utilize the signal as a stimulus signal in a spectral measurement of at least one frequency dependent property of the probe,
the spectral measurement being based on an analysis of a frequency spectrum of a response signal from the probe and the stimulus signal, and
the at least one frequency dependent property being selected from a group comprising:
a complex impedance,
a conductivity, or
a dielectricity.

24. A spectrum analyzer comprising:
a signal generator configured to:
provide a stimulus signal for a spectral measurement of at least one frequency dependent property of a probe,
the stimulus signal comprising at least partially a quantization noise of a sigma-delta modulation, and
the stimulus signal being generated using a feedback path that provides a feedback signal to reduce a quantization error associated with modulating an input signal,
the stimulus signal being based on the feedback signal and the input signal,
the signal generator comprising an output configured to:
transfer the stimulus signal to the probe; and
a response analyzer configured to:
transform a response signal received from the probe into a spectral measurement of the response signal in a frequency domain,
wherein the stimulus signal is generated independent of the response signal received from the probe.

25. The spectrum analyzer of claim 24, wherein the signal generator is further configured to:
generate the stimulus signal by a sigma-delta modulation of a random input signal or a pseudo-random input signal.

* * * * *